(12) United States Patent
Naviasky et al.

(10) Patent No.: US 7,348,824 B2
(45) Date of Patent: Mar. 25, 2008

(54) AUTO-ZERO CIRCUIT

(75) Inventors: Eric Naviasky, Ellicott City, MD (US); Jim Brown, Livingston (GB)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 11/074,484

(22) Filed: Mar. 7, 2005

(65) Prior Publication Data
US 2006/0197574 A1    Sep. 7, 2006

(51) Int. Cl.
*H03L 5/00*    (2006.01)
(52) U.S. Cl. ............ 327/307; 375/345; 455/223
(58) Field of Classification Search ........... 327/307; 375/345; 455/223
See application file for complete search history.

(56) References Cited

U.S. PATENT DOCUMENTS 4,453,258 A * 6/1984 Richardson ............. 375/345
5,027,116 A * 6/1991 Armstrong et al. ......... 341/120

OTHER PUBLICATIONS

Graf, Rudolf, Modern dictionary of electronics, 7. ed., rev. and updated. Boston [u.a.]. Newnes. 1999. 869 S.. pp. (109 and 543).*
Bakker, A. et al. (Dec. 2000). "A CMOS Nested-Chopper Instrumentation Amplifier with 100-nV Offset," *IEEE Journal of Solid-State Circuits* 35(12):1877-1883.
Begueret, J.-B. et al. (Mar. 1997). "Converters Dedicated to Long-Term Monitoring of Strain Gauge Transducers," *IEEE Journal of Solid-State Circuits* 32(3):349-356.
Coln, M.C.W. (Dec. 1981). "Chopper Stabilization of MOS Operational Amplifiers Using Feed-Forward Techniques," *IEEE Journal of Solid-State Circuits* SC-16(6):745-748.
Enz, C.C. et al. (Jun. 1987). "A CMOS Chopper Amplifier," *IEEE Journal of Solid-State Circuits* SC-22(3):335-342.
Finvers, I.G. et al. (Feb. 1995). " A High Temperature Precision Amplifier," *IEEE Journal of Solid-State Circuits* 30(2):120-128.
Fotouhi, B. (Jul. 1994). "Optimization of Chopper Amplifiers for Speed and Gain," *IEEE Journal of Solid-State Circuits* 29(7):823-828.
Menolfi, C. et al. (Mar. 1999). "A Fully Integrated, Untrimmed CMOS Instrumentation Amplifier with Submicrovolt Offset," *IEEE Journal of Solid-State Circuits* 34(3):415-420.

* cited by examiner

*Primary Examiner*—Quan Tra
*Assistant Examiner*—Khareem Almo
(74) *Attorney, Agent, or Firm*—Morrison & Foerster LLP

(57) ABSTRACT

An auto-zero circuit is disclosed. The auto-zero circuit includes a first set of circuits for implementing a first auto-zero phase and a second set of circuits for implementing a second auto-zero phase. The first set of circuits includes a first differential amplifier and a first feedback path coupled between an output of the first differential amplifier and an input of the first differential amplifier. The second set of circuits includes a second differential amplifier and a second feedback path coupled between an output of the second differential amplifier and an input of the first differential amplifier, where the second feedback path includes an attenuation capacitor for reducing charge injection error and noise error of the auto-zero circuit and a holding capacitor for holding a voltage to be used to correct charge injection error introduced by the first feedback path.

17 Claims, 5 Drawing Sheets

AUTO-ZERO CIRCUIT

FIELD OF THE INVENTION

The present invention relates to the field of analog integrated circuit design. In particular, the present invention relates to an auto-zero circuit.

BACKGROUND OF THE INVENTION

The inherent offset of an integrated amplifier is on the order of millivolts (mV). To process baseband signals in the microvolt (μV) or less region, a means of reducing the offset of the amplifier is required. It is also desirable to reduce the level of the low frequency noise without using large input transistors. One method for correcting the inherent offset is shown in FIG. 1.

FIG. 1a illustrates a prior art feed-forward amplifier for correcting the inherent offset of the amplifier. The feed-forward amplifier includes a main differential amplifier 102, an auxiliary amplifier 103, a second stage amplifier 104 and its compensation capacitor 105, and an output amplifier 106. The main differential amplifier 102 has two sets of inputs. The first set of inputs is 110, and the second set of inputs is 112, which is coupled to a first hold capacitor 114. Similarly, the auxiliary amplifier 103 has two sets of inputs. The first set of inputs is 111, and the second set of inputs is 119, which is coupled to a second hold capacitor 120. Both the main amplifier 102 and the auxiliary amplifier 103 are controlled by the switches SW1 115, SW2 116, SW3 117, and SW4 118.

The feed-forward amplifier has two modes of operation. In the first mode, the auxiliary amplifier 103 is cascaded with the main amplifier 102. In the second mode, the main amplifier 102 is used alone. In the first mode, the forward gain of the composite amplifier is the product of the gain of the main amplifier 102 and the auxiliary amplifier 103. In the second mode the gain is just the gain of the main amplifier 102.

When the feed-forward amplifier is used in an application, the gain developed may be represented by $$Av = \frac{Av}{1+AvB}$$

where Av is the forward gain of the amplifier and B is the feedback attenuation. This gain can be rearranged to $$\frac{1}{B} \times \frac{1}{1+\frac{1}{AvB}}$$

where the first term represents the ideal gain for the circuit and the second term represents the error due to the finite loop gain.

In the feed-forward amplifier, the error has a time varying component as the amplifier cycles between the first mode and the second mode. Multiplying by a periodic time varying gain is a well-known mixing process used in many radios. In this case, the mixing operation produces sidebands to the desired signal offset by the auto-zero frequency. These sidebands can adversely impact the operation of the feed-forward amplifier when the input frequency is very close to the auto-zero frequency and the side band appears at or around the frequency of direct current (DC). This problem described above is commonly referred to as the intermodulation problem.

FIG. 1b illustrates another prior art circuit for correcting the inherent offset of the amplifier. As shown in FIG. 1b, the circuit includes a first differential amplifier (amplifier A) 122, a second differential amplifier (amplifier B) 123, a second stage amplifier 124 and its compensation capacitor (Cc) 125, and an output amplifier 126. The first differential amplifier 122 has two sets of inputs. The first set of inputs is 130a and 130b. The second set of inputs is 132 and 133, which are coupled to a first reference voltage (Vref_a) and a first hold capacitor ($C_{H1}$) 136 respectively. The input/output (I/O) of the first differential amplifier is controlled by the switches SW1 140, SW2 142, SW6 152, and SW7 154. Similarly, the second differential amplifier 123 has two sets of inputs. The first set of inputs is 130a and 130b. The second set of inputs is 134 and 135, which are coupled to a second reference voltage (Vref_b) and a second hold capacitor ($C_{H2}$) 138 respectively. The I/O of the second differential amplifier is controlled by the switches SW3 146, SW4 148, SW5 150, and SW8 156.

The circuit has two modes of operation. In the first mode, input amplifier A 122 is being used in the signal path and input amplifier B 123 is being auto-zeroed. In this mode, the switches SW2 142, SW3 146, SW6 152, and SW8 156 are closed and switches SW1 140, SW4 148, SW5 150, and SW7 154 are open. In the second mode, input amplifier B 123 is being used in the signal path and input amplifier A 122 is being auto-zeroed. In this mode, SW1 140, SW4 148, SW5 150, and SW7 154 are closed and switches SW2 142, SW3 146, SW6 152, and SW8 156 are open. The first mode and second mode are operated alternatively.

When either input amplifier A or input amplifier B is being used in the signal path, the main inputs 130a and 130b are connected to the input pins of the circuit through the switches SW2 142 or SW4 148 respectively. The offset of an input amplifier is the sum of the inherent offset of the amplifier and the voltage difference applied to the auxiliary inputs (132 and 133 for amplifier A, and 134 and 135 for amplifier B) which were set during the prior phase. The output of the input amplifier is coupled through either SW5 150 or SW6 152 to the second stage amplifier 124 and its compensation capacitor Cc 125 for additional gain and frequency shaping. The output of the second stage amplifier is buffered by the output amplifier 126 to drive an output load.

When either input amplifier A 122 or input amplifier B 123 is in the auto-zero mode, the main inputs 130a and 130b are shorted by either SW1 140 or SW3 146 and the output is connected to the auxiliary inputs. The amplifier will reach a steady state where the voltage difference applied to the auxiliary inputs cancels the inherent offset of the input amplifier to within an accuracy determined by the finite gain of the loop. This voltage will be held by either the hold capacitor $C_{H1}$ 136 or $C_{H2}$ 138 when SW7 154 or SW8 156 is opened. The auto-zeroed input amplifier is then used in the signal path.

There are a number of issues with the circuit of FIG. 1b. First, errors may result from the charge injection of the sample switch SW7 154 onto the first hold capacitor $C_{H1}$ 136 and the charge injection of the sample switch SW8 156 onto the second hold capacitor $C_{H2}$ 138. The offset from the charge injection may be represented by $$\frac{1}{Kg} \times \frac{Q_{inj}}{C_{Hold}},$$

where $K_g$ is the gain from the main inputs 130a and 130b divided by the gain from the auxiliary inputs (132 and 133 for amplifier A, and 134 and 135 for amplifier B), $Q_{inj}$ is the charge injected by the sample and hold switch (on the order of half the gate capacitance times the clock swing), and $C_{hold}$ is the hold capacitor ($C_{H1}$ 136 for amplifier A, and $C_{H2}$ 138 for amplifier B). In older low-cost processes, the charge injection may be as high as 20 femto-Coulomb (fC). In newer processes, the charge injection may drop to as low as 0.25 fC, but the voltage capabilities in such new processes tend not to be adequate for the high dynamic range applications. The size of the hold capacitor 114 is typically limited, which restricts its capacitance to no more than several 10 s of pico-Farad (pF) to minimize expensive chip area. The relative gains from the two sets of inputs are about the same, the $K_g$ is about one. Thus for older processes with a $Q_{inj}$ of 20 fC, a hold capacitor of 20 pF, and a $K_g$ of 1, the input offset may be about 1 mV, which represents no significant improvement over the uncorrected offset. For newer deep sub-micron processes, the offset may be 12.5 µV, which is insufficient for applications that require signals in the microvolt region.

In addition, there is an offset error resulting from the finite gain of the amplifier. When the amplifier is in auto-zero mode, the input differential is zero since the inputs 130a and 130b are shorted together. However the output of the amplifier is at a voltage that is determined by the auxiliary inputs, not at the voltage determined by the amplifier in its normal mode of operation. The difference between this output voltage and the output voltage when in normal operational mode, divided by the gain, represents the input offset voltage. With an older processing technology, the gain of the auto-zero stage may be on the order of 60 decibels (dB) or 1000 times. For 1 mV of offset and equal gain from the main and auxiliary inputs, there is an error of 1 µV at the input of the amplifier. If an attempt to reduce the charge injection error is made that reduces the effective gain to the auxiliary inputs, the offset increases proportionally. If the effective gain on the auxiliary inputs is reduced by a factor of a thousand in order to reduce the charge-injection caused offset to 1 µV, the open loop gain would have to be raised to 120 dB to keep the finite gain error at 1 µV. This is not practical for most applications.

Furthermore, there is broadband noise that is aliased down to baseband from the sampling operation. The noise has several facets, some of which are related. One is the noise of the amplifier in the total bandwidth of the auto-zero loop when it is brought down to baseband. The other noise is the $$\sqrt{\frac{kT}{C}}$$

noise (also referred to as the kTC noise) of the hold capacitor at the auxiliary input of the amplifier, where k is the Boltzmann's Constant of approximately $1.3807 \times 10^{-23}$ Joules per Kelvin (J K$^{-1}$), T is the absolute temperature, and C is the capacitance of $C_{hold}$. The kTC noise is quite large for values of hold capacitor that can be integrated on chip. For example, it is on the order of 20 µV for a 10 pF capacitor.

One approach to address the above issues is to use large capacitors. In some implementations, the capacitors may be external to the chip containing the amplification circuit. In others implementations the large area of the capacitors may be tolerated on the chip. The use of newer deep sub-micron processes makes this possible, although this approach is expensive because of the large chip area and the advanced process technology employed.

As discussed above, the prior art solutions require large on-chip area, external components, or expensive newer processing technology. All such solutions lead to higher product costs. Therefore, there is a need for a low-cost solution for processing very small baseband signals that addresses the issues of charge injection error, finite gain limitations and noise problems.

SUMMARY

The accuracy of an auto-zero circuit is limited by the charge injection of the switches, the finite gain limitations, and the noises of the amplifier. A multi-phase approach is used to reduce the charge injection error, the finite gain limitations, and the noises of the amplifier. The first phase operates as a basic correction step for correcting the inherent offset of the amplifier; the second phase is capacitive attenuated to divide down the charge injection error due to sampling of its switches; and the third stage corrects the finite gain error resulting from the second stage operation and further reduces the offset due to charge injection. The bandwidth of the second and third stage operation is reduced to the minimum needed for the amplifier output signal to settle in the allowed time and to limit the noise bandwidth to the minimum possible.

In one embodiment, an auto-zero circuit includes a first set of circuits for implementing a first auto-zero phase and a second set of circuits for implementing a second auto-zero phase. The first set of circuits includes a first differential amplifier and a first feedback path coupled between an output of the first differential amplifier and an input of the first differential amplifier. The second set of circuits includes a second differential amplifier and a second feedback path coupled between an output of the second differential amplifier and an input of the first differential amplifier, where the second feedback path includes an attenuation capacitor for reducing charge injection error and noise error of the auto-zero circuit and a holding capacitor for holding a voltage to be used to correct charge injection error introduced by the first feedback path.

In another embodiment, a method for performing offset adjustment of an auto-zero circuit includes correcting an inherent offset of the auto-zero circuit by a first set of circuits in a first auto-zero phase and reducing charge injection error and noise error of the auto-zero circuit by a second set of circuits in a second auto-zero phase. The first set of circuits includes a first differential amplifier and a first feedback path coupled between an output of the first differential amplifier and an input of the first differential amplifier. The second set of circuits includes a second differential amplifier and a second feedback path coupled between an output of the second differential amplifier and an input of the first differential amplifier, where the second feedback path includes an attenuation capacitor and a holding capacitor.

BRIEF DESCRIPTION OF THE DRAWINGS

The aforementioned features and advantages of the invention as well as additional features and advantages thereof will be more clearly understandable after reading detailed descriptions of embodiments of the invention in conjunction with the following drawings.

DESCRIPTION OF EMBODIMENTS

Various embodiments of auto-zero circuits are described and methods are provided for performing offset adjustment of an auto-zero circuit. The following descriptions are presented to enable any person skilled in the art to make and use the invention. Descriptions of specific embodiments and applications are provided only as examples. Various modifications and combinations of the examples described herein will be readily apparent to those skilled in the art, and the general principles defined herein may be applied to other examples and applications without departing from the spirit and scope of the invention. Thus, the present invention is not intended to be limited to the examples described and shown, but is to be accorded the widest scope consistent with the principles and features disclosed herein.

Figure 1A:
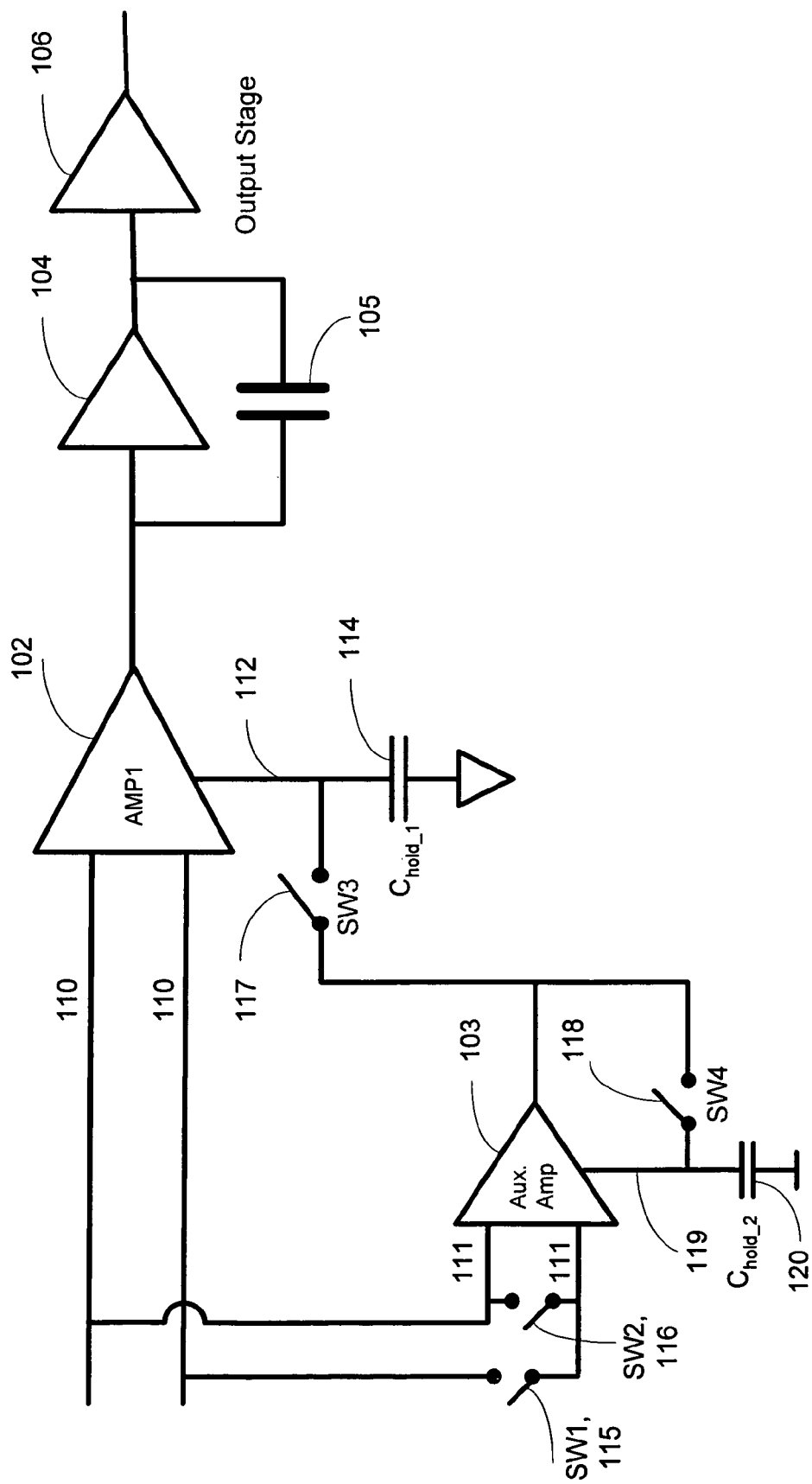
FIG. 1a illustrates a prior art feed-forward amplifier for correcting the inherent offset of the amplifier.
Figure 1B:
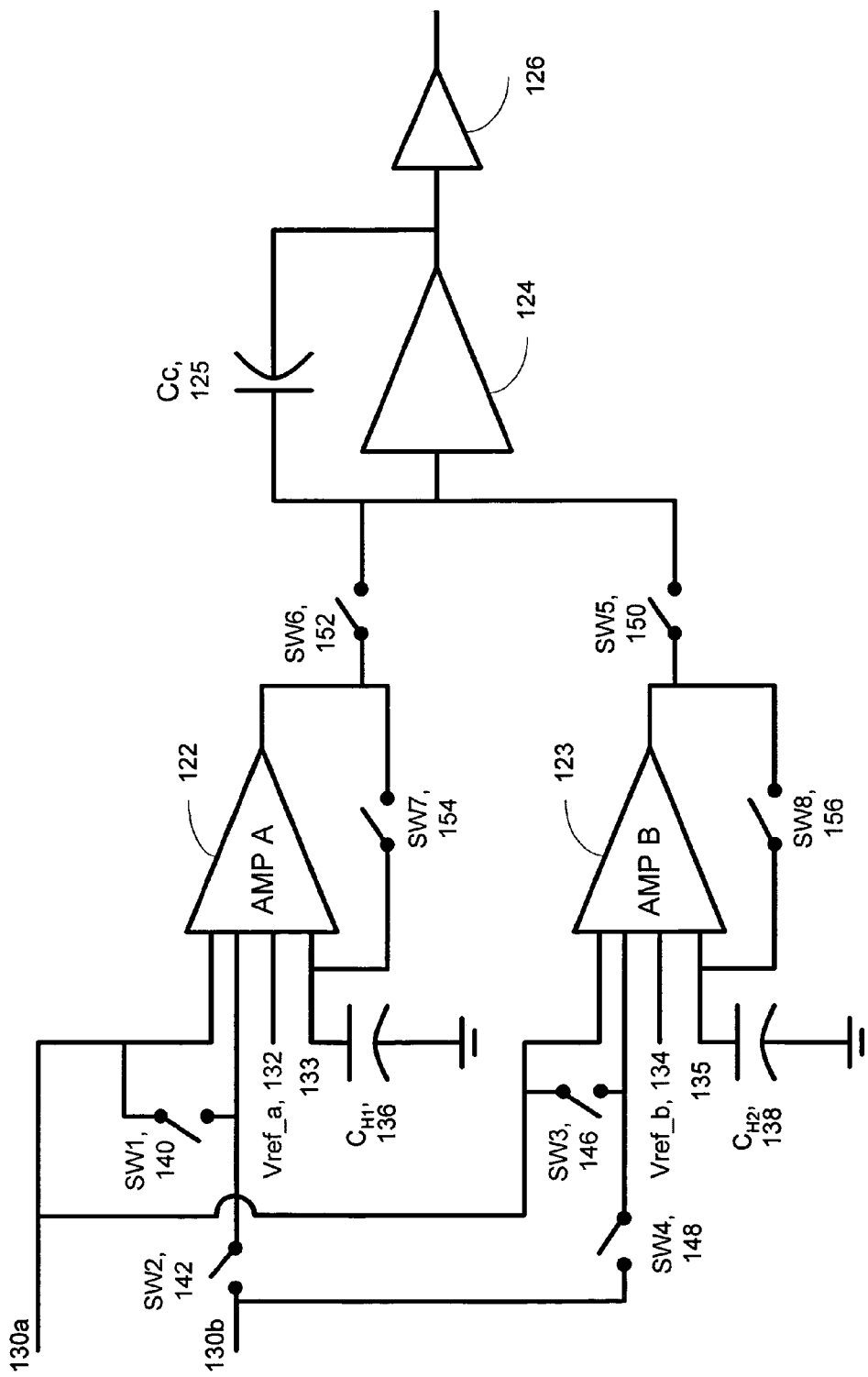
FIG. 1b illustrates another prior art circuit for correcting the inherent offset of the amplifier.
Figure 2:
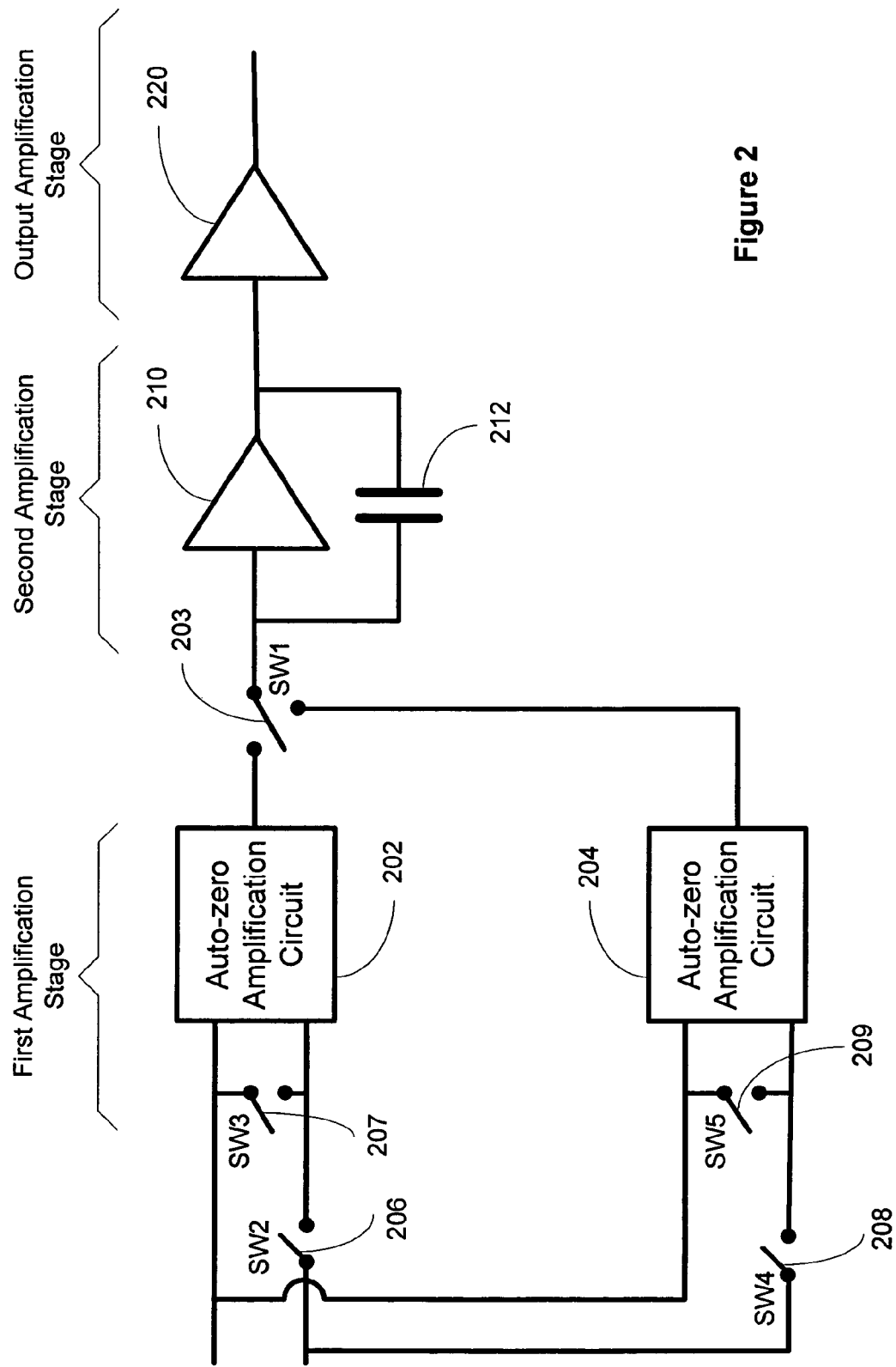
FIG. 2 illustrates a block diagram of a ping-pong architecture where an auto-zero circuit is used according to an embodiment of the present invention.

FIG. 2 illustrates a block diagram of a ping-pong architecture where an auto-zero circuit is used according to an embodiment of the present invention. As shown in FIG. 2, the ping-pong architecture includes a first amplification stage, a second amplification stage, and an output stage. The first amplification stage includes a first auto-zero amplification circuit 202 and a second auto-zero amplification circuit 204. With the ping-pong architecture, a first switch (SW1) 203 selects one of the two auto-zero amplification circuits for normal mode of operation (use mode) and the other auto-zero amplification circuit for auto-zero mode. For example, when the auto-zero amplification circuit 202 is in use mode, the auto-zero amplification 204 is in auto-zero mode, or vice versa. A second switch (SW2) 206 is closed and a third switch (SW3) 207 is opened when the first auto-zero amplification circuit 202 is in use mode, and a fourth switch (SW4) 208 is opened and a fifth switch (SW5) 209 is closed when the second auto-zero amplification circuit is in auto-zero mode. Similarly, SW2 206 is opened and SW3 207 is closed when the first auto-zero amplification circuit is in auto-zero mode, and SW4 208 is closed and SW5 209 is opened when the second auto-zero amplification circuit 204 is in use mode.

The second amplification stage includes a second amplifier 210 and a feedback capacitor 212 coupling between the input and output of the second amplifier 210. The third stage is an output amplification stage, which includes a third amplifier 220.

Auto-Zero Mode

When the first auto-zero amplification circuit 202 is in auto-zero mode, SW2 206 is opened and SW3 207 is closed, which removes the differential between the two inputs to the first auto-zero amplification circuit. Similarly, when the second auto-zero amplification circuit 204 is in auto-zero mode, SW4 208 is opened and SW5 209 is closed, which removes the differential between the two inputs to the second auto-zero amplification circuit.

In auto-zero mode, the auto-zero amplification circuit may be operated in multiple phases. In one embodiment, phase 1 corrects the inherent offset of the amplifier. Phase 2 reduces the charge injection error and removes noises of the auto-zero amplification circuit introduced by phase 1. Phase 3 reduces the finite gain error and further reduces the noise of the auto-zero amplification circuit.

Figure 3:
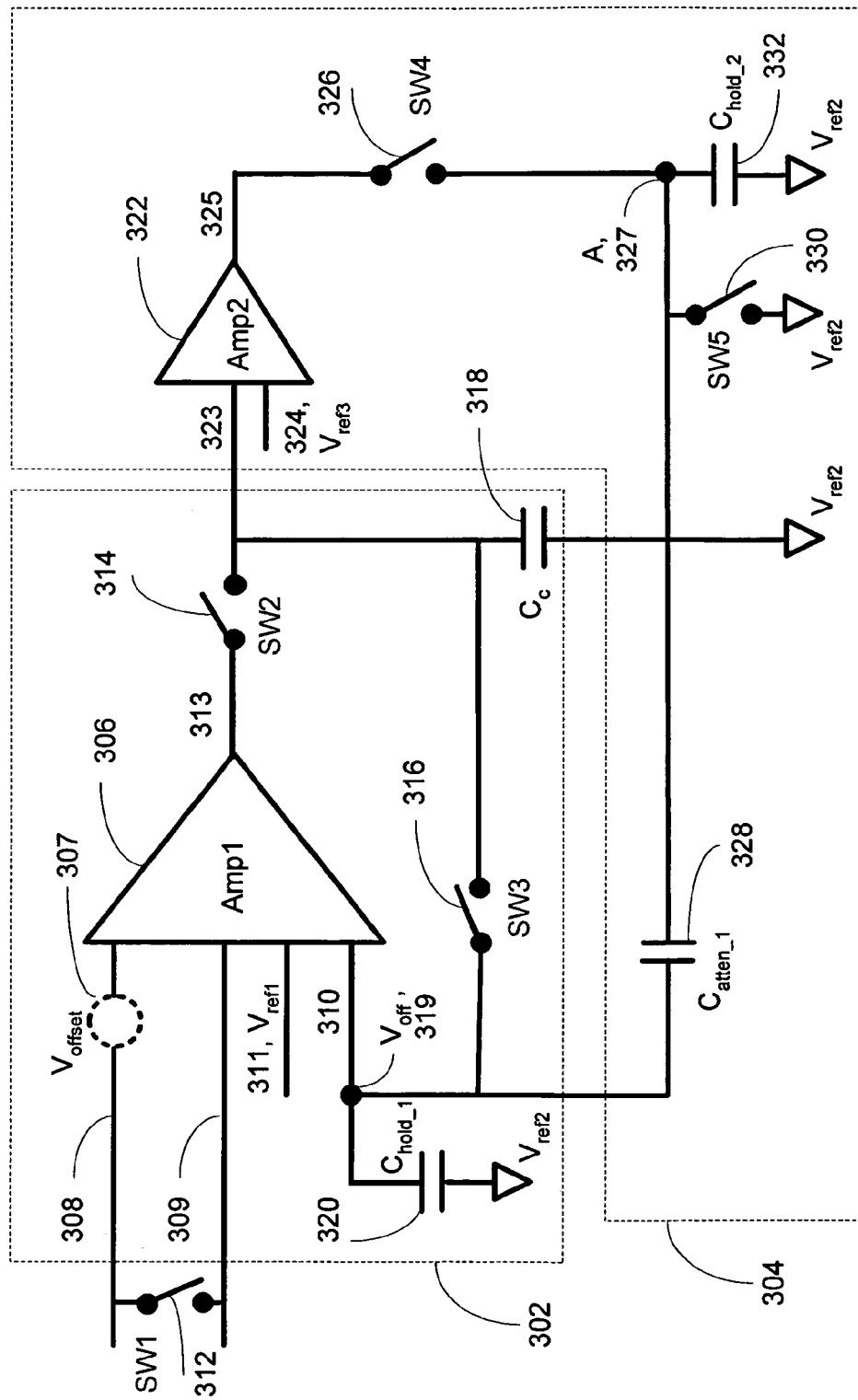
FIG. 3 illustrates an implementation of one of the auto-zero circuits of FIG. 2 according to an embodiment of the present invention.

FIG. 3 illustrates an implementation of one of the auto-zero amplification circuits of FIG. 2 according to an embodiment of the present invention. As shown in FIG. 3, the auto-zero amplification circuit includes a first set of circuits 302 and a second set of circuits 304. The first set of circuits 302 includes a first differential amplifier (Amp1) 306 and a first feedback path coupled between an output and an input of Amp1 306.

The first differential amplifier 306 includes a first pair of differential inputs 308 and 309, and a second pair of differential inputs (also known as auxiliary inputs) 310 and 311. A first switch (SW1) 312 is coupled between the inputs 308 and 309 of the first pair of differential inputs. The inherent offset ($V_{offset}$) 307 of Amp1 is shown as a dotted circuit coupled to the input 308. The second pair of differential inputs includes a first input 310 coupled to the output of Amp1 through the first feedback path, a second input 311 coupled to a reference voltage source ($V_{ref1}$). Amp1 further includes an output 313 coupled to the first feedback path and to an input of the second set of circuits 304.

The inputs 310 and 311 of Amp1 is designed to produce canceling differentials to correct the inherent offset between the inputs 308 and 309. The correction voltage between inputs 310 and 311 is obtained by shorting the conventional inputs 308 and 309 of Amp1 and using one or more feedback loops around the amplifier with the auxiliary input 310. The voltage on the auxiliary input 310 is held by one or more holding capacitors so that AMP1 can then be used in a normal fashion.

The first feedback path includes a second switch (SW2) 314, a third switch (SW3) 316, a compensation capacitor ($C_c$) 318, and a first holding capacitor 320 ($C_{hold\_1}$). The compensation capacitor 318 is connected between the output 313 of Amp1 306 via the second switch 314 and a second reference voltage source ($V_{ref2}$). The compensation capacitor 318 provides stability to the output of Amp 1 during the second and third phases of the auto-zero operation. The first holding capacitor $C_{hold\_1}$ 320 is coupled between the node $V_{off}$ 319 and the second reference voltage source $V_{ref2}$.

The second set of circuits 304 includes a second differential amplifier (Amp2) 322 and a second feedback path coupled between an output of Amp2 and the input 310 of Amp1.

The second differential amplifier 322 includes a first input 323 coupled to the output 313 of Amp1 306 via the second switch 314, a second input 324 coupled to a third reference voltage source ($V_{ref3}$), and an output 325 coupled to the second feedback path.

The second feedback path includes a fourth switch (SW4) 326, a first attenuation capacitor ($C_{atten\_1}$) 328, a fifth switch (SW5) 330, and a second holding capacitor ($C_{hold\_2}$) 332.

The fourth switch 326 has a first port is coupled to an output of AMP2 and a second port coupled to the second holding capacitor 332. The first attenuation capacitor 328 has a first port coupled to the second port of the fourth switch and a second port coupled to the input 310 of Amp1 306. The fifth switch 330 has a first port coupled to the node A 327 and a second port coupled to the $V_{ref2}$. The second holding capacitor 332 is coupled between the node A 327 and the $V_{ref2}$.

In the example as shown in FIG. 3, the size of $C_{hold\_1}$ is about 10 pico-Farad (pF); the size of $C_c$ is about 1 pF; the size of $C_{atten\_1}$ is about 10 femto-Farad (fF); and the size of $C_{hold\_2}$ is about 15 pF.

Figure 4:
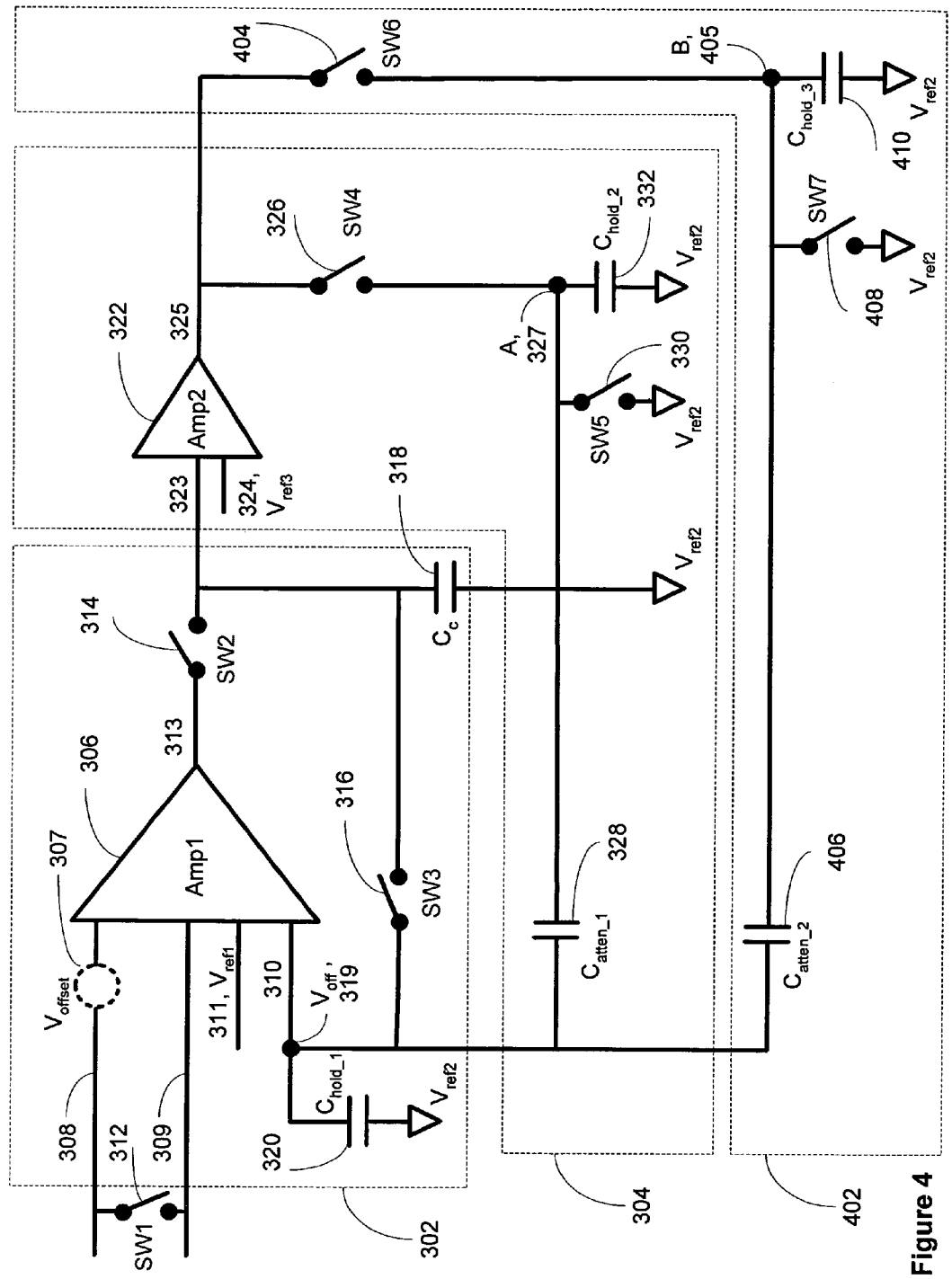
FIG. 4 illustrates another implementation of an auto-zero circuit according to an embodiment of the present invention.

FIG. 4 illustrates another implementation of an auto-zero amplification circuit according to an embodiment of the present invention. In addition to the first set of circuits 302 and the second set of circuits 304, the auto-zero amplification circuit further includes a third set of circuits 402. The third set of circuits includes a third feedback path coupled between the output 325 of the second differential amplifier 322 and the input 310 of Amp1 306.

The third feedback path includes a sixth switch (SW6) 404, a second attenation capacitor ($C_{atten\_2}$) 406, a seventh switch (SW7) 408, and a third holding capacitor ($C_{hold\_3}$) 410. The second attenation capacitor is coupled between the output of Amp2 322 via SW6 and the node $V_{off}$ 319. The third holding capacitor is coupled between the node B 405 and the $V_{ref2}$.

In the example as shown in FIG. 4, the size of $C_{hold-1}$ is about 10 pF; the size of $C_c$ is about 1 pF; the size of $C_{atten\_1}$ is about 30 fF; the size of $C_{hold\_2}$ is about 5 pf; the size of $C_{hold\_3}$ is about 10 pF; and the size of $C_{atten\_2}$ is about 10 fF.

Auto-Zero Mode Phase 1

Referring to FIG. 3, in phase 1 of the auto-zero mode, the inputs 308 and 309 are shorted by switch SW1 312 and the switches SW2 314 and SW3 316 are closed to form the first feedback loop of Amp1 306. In addition, the switch SW5 330 is also closed to reset the capacitor $C_{hold\_2}$ 332. It should be noted that the $V_{ref2}$ is not necessarily a circuit ground. Instead, it is a convenient and stable reference voltage source. At the end of auto-zero phase 1, SW3 316 and SW5 330 are opened. Opening of the switch SW3 injects charge into $C_{hold\_1}$ 320, which produces an offset to the auxiliary inputs 310 and 311 of Amp1 306. In this example, the charge injection error may be on the order of 1 mV.

Auto-Zero Mode Phase 2

In phase 2 of the auto-zero mode, SW5 is opened and SW4 is closed. A second feedback loop is provided that contains the second differential operation amplifier 322 and the first attenuation capacitor $C_{atten\_1}$ 328. The second differential operation amplifier 322 is a broadband low gain amplifier that serves as a buffer and provides a reference point for the output signal of the first differential operation amplifier 306. The reference point is a desired voltage output at 313 when the first differential operation amplifier 306 is in use. The $C_c$ 318 is a compensation capacitor for the first differential operation amplifier 306 when it is in the second and third phases of the auto-zero mode. The capacitor need not be larger than required to ensure stability for the much higher closed loop gain that is used in the later two phases of auto-zero mode. The second feedback loop servos to its stable point. Because of the large attenuation in the second feedback loop, a large voltage gain is formed due to the finite gain of the amplifier. For this example, the feedback attenuation is about 300 times, which means that the output of Amp2 has to be at about 300 mV to cancel out a charge injection of 1 mV (300 mV/300) on $C_{hold\_1}$. Amp2 322 has a small but broadband gain of about 4, so the error at the output of Amp1 is about 75 mV (300 mV/4). At the end of phase 2, SW4 is opened. As a result, the voltage on $C_{hold2}$ (node A) moves by about 1 mV from its previous value of roughly 300 mV, due to the charge injection error introduced by opening SW4. This is reflected as an input offset shift of only about 3 µV (1 mV/300) due to the action of the first attenuation capacitor 328. Note that the first auto-zero phase and the second auto-zero phase are performed sequentially.

Auto-Zero Mode Phase 3

The third set of circuits of FIG. 4 implements the third phase of the auto-zero amplification circuit according to an embodiment of the present invention. In phase three, SW6 404 is closed and SW7 408 is opened. Node B 405 needs to shift by about 3 mV to correct for the 3 µV error introduced at the end of phase 2 due to charge injection. This is only a 0.75 mV error at the output of Amp1 306, which when combined with the high gain of Amp1 306 (80+dB) produces a less than 1 µV error from finite gain. At the end of phase 3, SW6 is opened. The effect of charge injection of 0.5 mV at node B from the opening of SW6 404 is attenuated by about 1000 times, to only 0.5 µV (0.5 mV/1000) at node $V_{off}$ due to the ratio between $C_{hold\_1}$ and $C_{atten\_2}$. The bandwidth in phase three is limited by the high feedback factor (net 1/250) and the compensation capacitor $C_c$. The bandwidth is set to just allow full settling in the time allowed for phase three and no more. This limits the noise to substantially the minimum. The kTC $$\left(\sqrt{\frac{kT}{C}}\right)$$

noise at node B is the most significant one, because the errors at node A 327 and at node $V_{off}$ 319 are reduced by the operations of phase 1 and phase 2. Since the noise at node B 405 is attenuated by about 1000 times, its adverse impact is diminished.

Note that the three auto-zero phases are performed sequentially. Also, the times allocated to each of the phases are not the same. A relative longer period of time is allocated to phase 3 than to phase 1 and phase 2. The reason the bulk of the time is allocated to phase 3 is to minimize the noise bandwidth.

The third phase is also used to reduce the finite gain error of the amplification circuit. Note the circuit used to implement phase 3 may be optional if an application does not concern about the finite gain error, or if the auto-zero amplification circuit is used in applications where the finite gain error is not a problem. In addition, more than three phases may work in the same fashion as described above and that method may require less dynamic range for the amplifier, because when more than three phases are used, the total amount of attenuation may be implemented in smaller increments. Furthermore, different implementations of the auto-zero amplification circuit, such as different ratios and different gains for the differential operational amplifier blocks and different values of capacitors, may be used.

The disclosed auto-zero amplification circuit has numerous advantages. First, it reduces errors due to the charge injection introduced by opening and closing of the switches. In addition, it reduces errors due to the finite gain of the amplifier. Moreover, it reduces the aliasing of broadband noise and reduces the kTC noise of the amplification circuit. The above advantages are obtained without using the expensive newer processing technology and large on-chip or off-chip capacitors. Therefore, the disclosed auto-zero amplification circuit provides a high-quality and low-cost solution for processing baseband signals in microvolt regions. Note that the auto-zero amplification circuit can be used in any system that needs to process very small baseband signals. For example, it can be used in portable equipment battery monitoring, telemetry applications, and test equipment applications.

One skilled in the relevant art will recognize that many possible modifications and combinations of the disclosed embodiments may be used, while still employing the same basic underlying mechanisms and methodologies. The foregoing description, for purposes of explanation, has been written with references to specific embodiments. However, the illustrative discussions above are not intended to be exhaustive or to limit the invention to the precise forms disclosed. Many modifications and variations are possible in view of the above teachings. The embodiments were chosen and described to explain the principles of the invention and their practical applications, and to enable others skilled in the art to best utilize the invention and various embodiments with various modifications as are suited to the particular use contemplated.

What is claimed is:

1. An auto-zero circuit, comprising:
    a first set of circuits for implementing a first auto-zero phase, wherein the first set of circuits comprises a first differential amplifier and a first feedback path coupled between an output of the first differential amplifier and an input of the first differential amplifier;
    a second set of circuits for implementing a second auto-zero phase, wherein the second set of circuits comprises a second differential amplifier and a second feedback path directly coupled between an output of the second differential amplifier and the input of the first differential amplifier and wherein the second feedback path comprises an attenuation capacitor for reducing charge injection error and noise error of the auto-zero circuit and a holding capacitor for holding a voltage to be used to correct charge injection error introduced by the first feedback path, wherein the first auto-zero phase and the second auto-zero phase are performed sequentially; and
    a third set of circuits for implementing a third auto-zero phase, wherein the third set of circuits comprise a third feedback path for reducing finite gain error and noise error of the auto-zero circuit, and wherein the third feedback path is coupled between the output of the second differential amplifier and the input of the first differential amplifier.

2. The auto-zero circuit of claim 1, wherein the first differential amplifier comprises:
    a first pair of differential inputs, wherein a first switch is coupled between a first input and a second input of the first pair of differential inputs;
    a second pair of differential inputs, wherein the second pair of differential inputs comprise a first input coupled to the output of the first differential amplifier through the first feedback path and a second input coupled to a reference voltage source; and
    an output coupled to the first feedback path and to an input of the second set of circuits.

3. The auto-zero circuit of claim 1, wherein the first feedback path comprises:
    a second switch coupled to an output of the first differential amplifier;
    a third switch coupled between the output of the first differential amplifier via the second switch and an input of the first differential amplifier;
    a compensation capacitor coupled between an output of the first differential amplifier via the second switch and a reference voltage source, wherein the compensation capacitor provides stability to the output of the first differential amplifier in the second auto-zero phase; and
    a first holding capacitor coupled between the input of the first differential amplifier and the reference voltage source.

4. The auto-zero circuit of claim 1, wherein the second differential amplifier comprises:
    a first input coupled to an output of the first differential amplifier via a second switch of the first set of circuits;
    a second input coupled to a reference source; and
    an output coupled to the second feedback path.

5. The auto-zero circuit of claim 1, wherein the second feedback path further comprises:
    a fourth switch having a first port and a second port, wherein the first port is coupled to an output of the second differential amplifier; and
    a fifth switch having a first port and a second port, wherein the first port is coupled to the second port of the fourth switch and the second port is coupled to the reference voltage source.

6. The auto-zero circuit of claim 1, wherein the second auto-zero phase and the third auto-zero phase are performed sequentially.

7. The auto-zero circuit of claim 1, wherein the third feedback path comprises:
    a sixth switch having a first port and a second port, wherein the first port is coupled to an output of the second differential amplifier;
    a second attenuation capacitor coupled between the second port of the sixth switch and an input of the first differential amplifier;
    a seventh switch having a first port and a second port, wherein the first port is coupled to the second port of the sixth switch and the second port is coupled to the reference voltage source; and
    a third holding capacitor coupled between the second port of the sixth switch and the reference voltage source.

8. The auto-zero circuit of claim 1, wherein the third auto-zero phase has a relatively longer duration than the first auto-zero phase and the second auto-zero phase respectively.

9. A method for performing offset adjustment of an auto-zero circuit, comprising:
    correcting an inherent offset of the auto-zero circuit by a first set of circuits in a first auto-zero phase, wherein the first set of circuits comprise a first differential amplifier and a first feedback path coupled between an output of the first differential amplifier and an input of the first differential amplifier;
    reducing charge injection error and noise error of the auto-zero circuit by a second set of circuits in a second auto-zero phase, wherein the second set of circuits comprise a second differential amplifier and a second feedback path directly coupled between an output of the second differential amplifier and the input of the first differential amplifier and wherein the second feedback path comprises an attenuation capacitor and a holding capacitor, wherein the first auto-zero phase and the second auto-zero phase are performed sequentially; and further reducing charge injection error and noise error of the auto-zero circuit by a third set of circuits in a third auto-zero phase, wherein the third set of circuits comprise a third feedback path coupled between the output of the second differential amplifier and the input of the first differential amplifier.

10. The method of claim 9, wherein the first differential amplifier comprises:
   a first pair of differential inputs, wherein a first switch is coupled between a first input and a second input of the first pair of differential inputs;
   a second pair of differential inputs, wherein the second pair of differential inputs comprise a first input coupled to the output of the first differential amplifier through the first feedback path and a second input coupled to a reference voltage source; and
   an output coupled to the first feedback path and to an input of the second set of circuits.

11. The method of claim 9, wherein the first feedback path comprises:
   a second switch coupled to an output of the first differential amplifier;
   a third switch coupled between the output of the first differential amplifier via the second switch and an input of the first differential amplifier;
   a compensation capacitor coupled between an output of the first differential amplifier via the second switch and a reference voltage source, wherein the compensation capacitor provides stability to the output of the first differential amplifier in the second auto-zero phase; and
   a first holding capacitor coupled between the input of the first differential amplifier and the reference voltage source.

12. The method of claim 9, wherein the second differential amplifier comprises:
   a first input coupled to an output of the first differential amplifier via a second switch of the first set of circuits;
   a second input coupled to a reference source; and an output coupled to the second feedback path.

13. The method of claim 9, wherein the second feedback path further comprises:
   a fourth switch having a first port and a second port, wherein the first port is coupled to an output of the second differential amplifier, and
   a fifth switch having a first port and a second port, wherein the first port is coupled to the second port of the fourth switch and the second port is coupled to the reference voltage source.

14. The method of claim 9, further comprises performing the second auto-zero phase and the third auto-zero phase sequentially.

15. The method of claim 9, wherein the third feedback path comprises:
   a sixth switch having a first port and a second port, wherein the first port is coupled to an output of the second differential amplifier;
   a second attenuation capacitor coupled between the second port of the sixth switch and an input of the first differential amplifier;
   a seventh switch having a first port and a second port, wherein the first port is coupled to the second port of the sixth switch and the second port is coupled to the reference voltage source; and
   a third holding capacitor coupled between the second port of the sixth switch and the reference voltage source.

16. The method of claim 9, wherein the third auto-zero phase has a relatively longer duration than the first auto-zero phase and the second auto-zero phase respectively.

17. The method of claim 9 further comprising:
   reducing noise error of the auto-zero circuit by the second set of circuits in the second auto-zero phase.

* * * * *